US006930475B2

(12) United States Patent
Stanimirov et al.

(10) Patent No.: US 6,930,475 B2
(45) Date of Patent: Aug. 16, 2005

(54) METHOD FOR THE TEMPERATURE-COMPENSATED, ELECTRO-OPTICAL MEASUREMENT OF AN ELECTRICAL VOLTAGE AND DEVICE FOR CARRYING OUT THE METHOD

(75) Inventors: Michael Stanimirov, Trimbach (CH); Klaus Bohnert, Oberrohrdorf (CH)

(73) Assignee: ABB Research LTD, Zurich (CH)

( * ) Notice: Subject to any disclaimer, the term of this patent is extended or adjusted under 35 U.S.C. 154(b) by 146 days.

(21) Appl. No.: 10/467,305

(22) PCT Filed: Feb. 5, 2002

(86) PCT No.: PCT/CH02/00068

§ 371 (c)(1),
(2), (4) Date: Aug. 6, 2003

(87) PCT Pub. No.: WO02/063317

PCT Pub. Date: Aug. 15, 2002

(65) Prior Publication Data

US 2004/0095570 A1 May 20, 2004

(30) Foreign Application Priority Data

Feb. 6, 2001 (EP) .............................................. 01810120

(51) Int. Cl.$^7$ .............................................. G01R 31/00
(52) U.S. Cl. .......................... 324/96; 324/72; 324/76.11
(58) Field of Search .......................... 324/96, 72, 76.11; 250/227.17–18, 336.1, 231.1, 339.01; 356/364–370, 925, 939

(56) References Cited

U.S. PATENT DOCUMENTS 4,629,323 A 12/1986 Matsumoto
5,895,912 A 4/1999 Bosselmann et al.

FOREIGN PATENT DOCUMENTS

EP 0 729 033 A2 8/1996

OTHER PUBLICATIONS

Valery N. Filippov et al., "Fiber Sensor for Simultaneous Measurement of Voltage and Temperature", IEEE Photonics Technology Letters, IEEE. New York, U.S., 2000, vol. 12, No. 11, pp. 1543–1545.

*Primary Examiner*—Paresh Patel
(74) *Attorney, Agent, or Firm*—Burns, Doane, Swecker & Mathis, L.L.P.

(57) ABSTRACT

For measuring an electric voltage in an electro-optic voltage converter, polarized light of two wavelengths is sent through a medium. At the output side, the light is led through a polarizer and the remaining signal is measured. For compensating a temperature dependence of the electro-optic coefficients, the measured results at both wavelengths are compared, and the voltage value consistant with both measurements is used.

6 Claims, 1 Drawing Sheet

METHOD FOR THE TEMPERATURE-COMPENSATED, ELECTRO-OPTICAL MEASUREMENT OF AN ELECTRICAL VOLTAGE AND DEVICE FOR CARRYING OUT THE METHOD

FIELD OF THE INVENTION

The invention relates to a method for measurement of an electrical voltage using an electrooptical medium as claimed in the precharacterizing clause of claim 1, and to an apparatus for measurement of an electrical voltage as claimed in the precharacterizing clause of claim 5.

BACKGROUND OF THE INVENTION

An electrooptical medium is a material whose refractive index and in which the speed of which light propagates vary for at least one light polarization when an electric field is applied.

The measurement of electrical voltages by means of electrooptical media is known. A corresponding appliance is disclosed, for example, in U.S. Pat. No. 4,904,931. This contains an electrooptical crystal between two polarizers. The Pockel effect causes a change in the refractive index in the crystal, and this leads to the light intensity being modulated after the second polarizer. This modulation is periodically dependent on the voltage. In order to obtain a unique measurement result, two beams at the same wavelength are therefore passed through the crystal in U.S. Pat. No. 4,904, 931.

U.S. Pat. No. 4,531,092 discloses a method for measurement of an electrical voltage, in which two beams at different wavelengths are sent through an electrooptical crystal. In the process, only one of the two beams is polarized on the outside, so that the intensity of the second beam is not dependent on the voltage. This measure allows the second beam to be used as a reference variable, and allows the accuracy of the measurement to be improved.

U.S. Pat. No. 5,895,912 discloses a method for measurement of an electrical voltage by means of an electrooptical medium, with light at only one wavelength being sent through the medium. Compensation for temperature influences is achieved by means of a temperature T that is assumed to be known, and by means of signal normalization and fit functions.

U.S. Pat. No. 4,629,323 discloses a measurement apparatus for measurement of an electrical voltage by means of an electrooptical medium, with polarized light waves at two frequencies $v_1$ $V_2$ and with different polarization being sent through the medium. The measurement signal is converted to an electrical signal at the frequency $|v_1-v_2|$, which is phase-modulated in accordance with a phase difference which the light waves experience in the electrooptical medium. No explicit method is disclosed for correction for a voltage value which has been found, by means of a measured temperature value.

EP 0 729 033 A2 discloses an apparatus for measurement of an electrical current by means of a magnetooptical medium, with two light beams at the same wavelength passing through the medium in opposite directions. Polarizers are located in front of and behind the medium, and are used to polarize the light waves. After passing through the respective second polarizer, the light waves are detected. The influence of the temperature on a signal which is measured in this way can be separated from the influence of the electrical current that is to be measured by virtue of the non-reciprocity of the Faraday effect.

A combined temperature and voltage sensor and corresponding method are disclosed in V. N. Filippov et al., "Fiber Sensor for Simultaneous Measurement of Voltage and Temperature", IEEE Photonics Tech. Lett. 12, 11 (2000). The voltage measurement is carried out by means of an electrooptically active crystal using two polarized light beams at different wavelengths. A $\lambda/4$ plate, which is used to produce the polarization, is used as a temperature-sensitive element, by means of which the temperature and the voltage can be determined via an equation system.

The sensor which is disclosed in the cited document by V. N. Filippov et al. forms the precharacterizing clause of patent claim 1. The method which is likewise disclosed forms the precharacterizing clause of claim 5.

For methods of the type mentioned above, the effective electrooptical coefficient must be known accurately. Since this coefficient is generally dependent on the temperature, this can lead to inaccuracies.

SUMMARY OF THE INVENTION

The invention is based on the object of providing a method of the type mentioned initially and the corresponding apparatus, by means of which it is possible to compensate for temperature-dependent fluctuations in a simple manner.

This object is achieved by the method as claimed in claim 1 and by the apparatus as claimed in claim 8.

According to the invention, two light beams at different wavelengths thus pass through the electrooptical medium, with the signals $A_1$, $A_2$ in the two light beams being measured after the output polarizer. These signals $A_1$, and $A_2$ are functions $f_1$ and $f_2$ of the electrical voltage V that is to be measured, and of the temperature T. According to the invention, a search is carried out for those values of the temperature T and of the voltage V which solve the equation system $$A_1 = f_1(T, V) \text{ and}$$

$$A_2 = f_2(T, V)$$

The additional information which results from the measurement at a second wavelength is thus used for determination of T and thus for elimination of the temperature dependency.

The apparatus according to the invention has an analyzer (polarizer), which polarizes a second of the two light beams, as well as a means for determination of those values of the temperature T and of the electrical voltage V, which solve the above equation system.

BRIEF DESCRIPTION OF THE DRAWINGS

Further refinements, advantages and applications of the invention result from the dependent claims and from the description which now follows, with reference to the figure, in which:

DETAILED DESCRIPTION OF THE INVENTION

Figure 1:
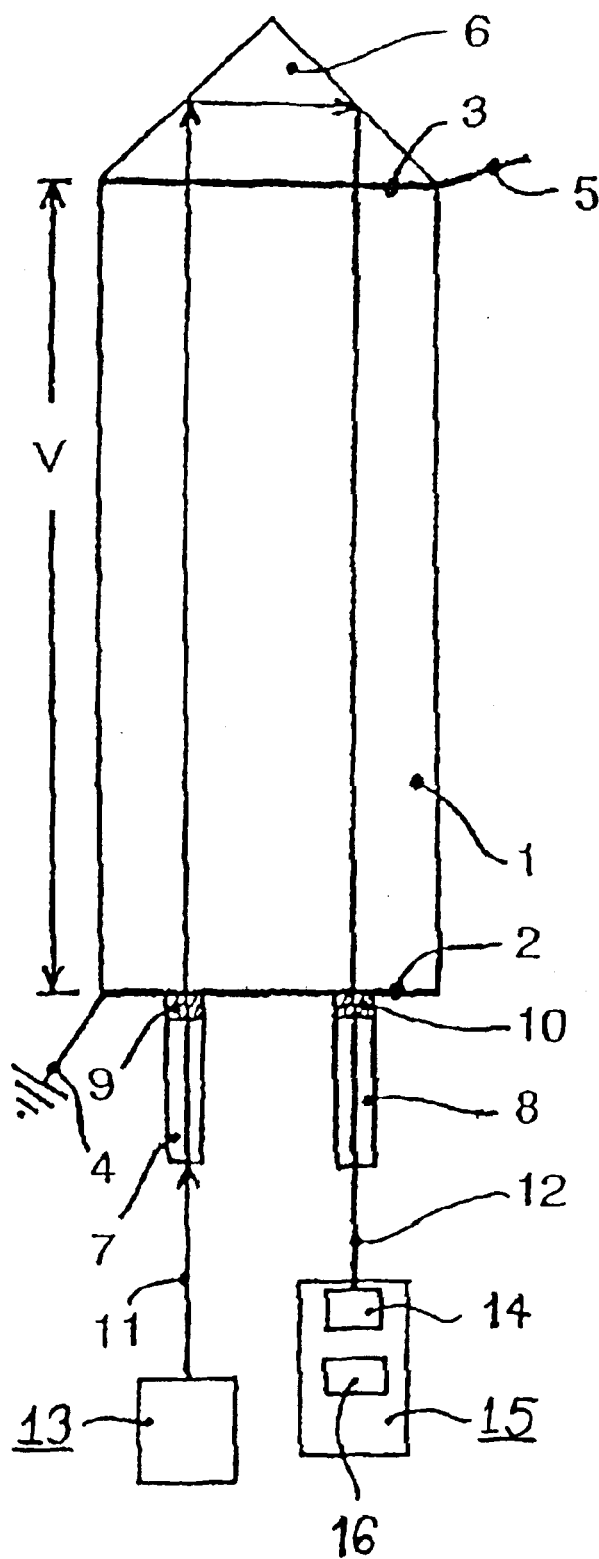
FIG. 1 shows a schematic illustration of a voltage converter that is suitable for carrying out the invention.

FIG. 1 shows a schematic illustration of a cuboid BGO crystal 1, which is provided on its two end faces with a coating composed of an electrically conductive, translucent material, in order to form two electrodes 2, 3. One electrode 2 is used as the ground potential connection 4, and the other electrode 3 is provided as the high-voltage potential connection 5. The voltage which is applied between the electrodes 2, 3 is annotated V. A deflection prism 6 is arranged on that end face of the BGO crystal 1 which forms the electrode 3, while two linear polarizers (or analyzers) 9 and 10 are located on the end face of the BGO crystal 1 which forms the electrode 2, and are connected to respective collimators 7 and 8.

The polarizers 9, 10 are oriented at 45° to the axes of the crystal. They may be parallel to one another or cast through 90°.

Two light beams 11 at different wavelengths $\lambda_1, \lambda_2$, which are generated in a light generation unit 13, are injected into the collimator 7. These beams pass through the polarizer 9 and, polarized by the electrode 2, into the BGO crystal 1 and pass through the electrode 3, are deflected on the boundary surfaces of the deflection prism 6 and then pass through the electrode 3, BGO crystal 1, the electrode 2, the polarizer that is used as the analyzer 10, and the collimator 8. The output light beams are annotated by the number 12. They are separated in a beam splitter 14 within a detection/evaluation unit 15, and their signals are acquired and evaluated individually in the detection/evaluation unit 15. In order to evaluate the signals, the detection/evaluation unit 15 contains an evaluation means 16. Those values of the temperature T and of the electrical voltage V which solve the equation system $A_1=f_1(T, V)$ and $A_2=f_2(T, V)$ are thus determined in the evaluation means 16.

If the polarizers are parallel, then the light propagation along the optical axis z for the signal strength (output power) $A_i=A(\lambda_i)$ of each light beam i=1.2 after the analyzer 10 is $$A_i = A_{0,i} \cdot \cos^2\left(\frac{\pi}{2} \cdot \frac{V}{V_h}\right), \quad (1)$$

where $A_{0,i}$ is the signal amplitude of the light beam i and $V_h$ is the half-cycle voltage for the present configuration. In this case, of course, $V_h=V_h(\lambda_i)$ should be considered as the half-cycle voltage at the wavelength $\lambda_1$. In the present case, the electric field is applied in the z direction of the crystal, and the half-cycle voltage $V_h$ is given by $$V_h(\lambda) = \frac{\lambda}{2 \cdot r_{63}(\lambda) \cdot n^3(\lambda)}, \quad (2)$$

where $r_{63}$ is the effective electrooptical coefficient of the material for the present configuration, $\lambda$ is the light wavelength of the respective light beam, and n is the refractive index of the crystal in the x or y direction.

If the polarizers are rotated at 90° with respect to one another then equation (1) is replaced by the following equation:

$$A_i = A_{0,i} \cdot \sin^2\left(\frac{\pi}{2} \cdot \frac{V}{V_h(\lambda_i)}\right). \quad (1')$$

In one preferred embodiment, a phase delay plate is inserted between the crystal and the output polarizer (analyzer) (or between the input polarizer and the crystal) and has a delay and orientation such that, when no voltage is applied, the phase difference between the two orthogonal polarizations at the output polarizer is 90°. The signal strength $A_i$ is in this case given by $$A_i = A_{0,i} \cdot \sin^2\left(\frac{\pi}{2} \cdot \frac{V}{V_h(\lambda_i)} - \frac{\pi}{4}\right). \quad (1^*)$$

A higher-order plate must be used for the phase delay plate to produce a delay of 90° at the two wavelengths. The advantage of using an additional phase delay plate is that it is possible to distinguish between positive and negative voltages.

In many conventional electrooptical media, the electrooptical coefficients r depend relatively strongly on the temperature T, that is to say a generally known temperature dependency $$r=r(T) \quad (3)$$

exists.

In this case, the value r represents the effective electrooptical coefficient for the respective configuration, crystal symmetry and wavelength. In the above example, $r=r_{63}$. Both r and r(T) in general also depend on the wavelength, of course.

The equations (1), (1') and (1*) can be described as follows in generalized form, taking into account the temperature dependency, for two light beams:

$$A_1=f_1(V, T) \text{ and} \quad (4a)$$

$$A_2=f_2(V, T), \quad (4b)$$

where, for example in the case of crossed polarizers 9, 10, the functions $f_i$ are given by $$f_i(V, T) = A_{0,i} \cdot \sin^2\left(\frac{\pi}{2} \cdot \frac{V}{V_h(\lambda_i, T)}\right). \quad (5)$$

For the case of parallel polarizers, the sine must be replaced by the cosine.

Using a linear approximation, the temperature dependency of r is by, for example:

$$r(\lambda i,T)=r(\lambda_i,T_0)+K_i'\cdot\Delta T, \quad (6)$$

where $r(\lambda i,T_0)$ is the electrooptical coefficient, which is assumed to be known, for a reference temperature $T_0$ and a wavelength $\lambda i$, $K_i'$ is a known temperature coefficient for a wavelength $\lambda i$, and $\Delta T=T-T_0$. The precise temperature T of the electrooptical medium is generally unknown.

For the above example, the equation system (4) in the situation according to equation (1') becomes $$A_1(V, T) = \qquad (7)$$
$$\frac{A_{0,1}}{2} \cdot \left[1 - \cos\left(2\pi \cdot \frac{n^3(\lambda_1, T_0) \cdot (r_{63}(\lambda_1, T_0) + K_1' \cdot \Delta T)}{\lambda_1} \cdot V\right)\right]$$

$$A_2(V, T) = \frac{A_{0,2}}{2} \cdot \left[1 - \cos\left(2\pi \cdot \frac{n^3(\lambda_2, T_0) \cdot (r_{63}(\lambda_2, T_0) + K_2' \cdot \Delta T)}{\lambda_2} \cdot V\right)\right]$$

The unknown parameter $\Delta T$ and hence the temperature T and the electrooptical coefficient $r_{63}(T)$ can be calculated from the equation system (7). In this case:

$$\Delta T = \frac{af - ce}{de - bf} \text{ where} \quad (8)$$

$$a = 2\pi \cdot n^3(\lambda_1, T_0) \cdot r_{63}(\lambda_1, T_0)/\lambda_1$$

$$b = 2\pi \cdot n^3(\lambda_1, T_0) \cdot K'_1/\lambda_1$$

$$c = 2\pi \cdot n^3(\lambda_2, T_0) \cdot r_{63}(\lambda_2, T_0)/\lambda_2$$

$$d = 2\pi \cdot n^3(\lambda_2, T_0) \cdot K'_2/\lambda_2$$

$$e = \arccos\left(1 - \frac{2A_1}{A_{0,1}}\right)$$

$$f = \arccos\left(1 - \frac{2A_2}{A_{0,2}}\right)$$

Once $\Delta T$ is known, then the voltage V can be calculated directly from one of the equations (7), since:

$$V = \arccos\left(1 - \frac{2 \cdot A_i}{A_{0,i}}\right) \cdot \frac{\lambda_i}{2\pi \cdot n^3(\lambda_i, T_0) \cdot (r_{63}(\lambda_i, T_0) + K'_i \cdot \Delta T)}. \quad (9)$$

Equation (9) has a unique solution $V \leq V_h(\lambda_i)$. If $V > V_h(\lambda_i)$, then it is necessary to search for that solution which solves both equations (4) (or (9) for i=1 and 2).

In principle, the temperature correction for the electrooptical coefficient in accordance with equation (8) and (6) can be carried out at a considerably slower rate than the actual measurement of the voltage V. It is also possible to determine the temperature only when the respective voltage is less than the half-cycle voltage, so that the problem of an ambiguous voltage determination is irrelevant.

The temperature correction is carried out in accordance with the equation (5) or (6) using the temperature discrepancy $\Delta T$ as determined according to (8). Thanks to this measure, the electrooptical coefficients are known more accurately, so that the voltage value V can be determined with greater accuracy and reliability.

It is likewise possible for the compensation method described in (8) to be transferred to the case of parallel polarizers according to equation (1), in which case the equation system (7) and the formulae for e and f in equation (8) change in a corresponding manner.

The compensation method can also be generalized to situations in which temperature dependency of the electrooptical coefficient is not linear, as in equation (6). This may be the situation in particular in the vicinity of a phase transition of an electrooptical medium. In this situation, the appropriate functions r(T) must be inserted in the equation system (7). If necessary, the solution to the equation (7) must then be determined numerically.

Values for r(T) can be found in the literature, as well as methods for determining such values. By way of example, appropriate details for a BGO crystal can be found for various wavelengths in K. S. Lee et al., "Optical, Thermo-optic, Electro-optic and Photo-elastic Properties of Bismuth Germanate ($Bi_4Ge_3O_{12}$)", National Bureau of Standards, USA 1988. Values for the temperature dependency of $n^3r$ are also given there. This combined electrooptical term $n^3r$ is referred to in the following text as R:

$$R = n^3 r \quad (10)$$

Since, as stated in equation (2), the half-cycle voltage $V_h$ depends on R, so that $A_i$ also depends on R, it is also possible to use R(T) for temperature compensation, instead of r(T). This makes it possible to achieve even better temperature compensation. The temperature dependency of r is generally considerably stronger than that of n (see, for example, the cited publication by K. S. Lee et al.) so that ignoring the temperature dependency of n, as has been stated above, results in a good approximation to the complete compensation by means of R(T).

The following formulae are obtained directly by analogy from the above equations for complete compensation, with these formulae in each case replacing those equations which have the same equation number, but without the prime:

$$R = R(T) = n^3(T) \cdot r(T) \quad (3')$$

$$R(\lambda, T) = R(\lambda, T_0) + K_i \cdot \Delta T \quad (6')$$

$K_i$ (without the prime) is thus the proportionality coefficients for linear temperature dependency of the combined electrooptical term $R = n^3 r$.

$$A_1(V, T) = \frac{A_{0,1}}{2} \cdot \left[1 - \cos\left(2\pi \cdot \frac{R^3(\lambda_1, T_0) + K_1 \cdot \Delta T}{\lambda_1} \cdot V\right)\right] \quad (7')$$

$$A_2(V, T) = \frac{A_{0,2}}{2} \cdot \left[1 - \cos\left(2\pi \cdot \frac{R^3(\lambda_2, T_0) + K_2 \cdot \Delta T}{\lambda_2} \cdot V\right)\right]$$

Determination of the temperature discrepancy:

$$\Delta T = \frac{af - ce}{de - bf} \text{ where} \quad (8')$$

$$a = 2\pi \cdot R^3(\lambda_1, T_0)/\lambda_1$$

$$b = 2\pi \cdot K_1/\lambda_1$$

$$c = 2\pi \cdot R^3(\lambda_2, T_0)/\lambda_2$$

$$d = 2\pi \cdot K_2/\lambda_2$$

$$e = \arccos\left(1 - \frac{2A_1}{A_{0,1}}\right)$$

$$f = \arccos\left(1 - \frac{2A_2}{A_{0,2}}\right)$$

Determination of the voltage:

$$V = \arccos\left(1 - \frac{2 \cdot A_i}{A_{0,i}}\right) \cdot \frac{\lambda_i}{2\pi \cdot (R^3(\lambda_i, T_0) + K_i \cdot \Delta T)} \quad (9')$$

Otherwise, the same procedure as that described in the situation further above with r(T) can be used for carrying out the invention with complete compensation by means of R(T) instead of r(T). This also applies to the transferability of the equations in the situation where the polarizer 9 and the analyzer 10 are aligned parallel to one another.

A BGO crystal is used as the electrooptical medium in the above examples, with the field being applied in the z direction and the light propagation in the z direction. It is also possible to use different geometries and different electrooptical media, such as crystals composed of $LiNbO_3$, BSO or noncentrally polarized polymers.

the techniques described here can also be applied to the media in which the electrooptical effect is not linear (Pockel effect) but obeys a square law (Kerr effect), in which case, in particular, the equations (1), (1'), (1*), (5), (7), (7'), (8), (8'), (9) and (9') must be adapted appropriately. Thus, for example, the sine of a square of the applied voltage must be calculated in equation (1').

LIST OF REFERENCE SYMBOLS

1: BGO crystal

2, 3: Electrodes

4: Ground potential connection
5: High-voltage potential connection
6: Deflection prism
7, 8: Collimators
9: Polarizer
10: Analyzer
11, 12: Injected and output light beams
13: Light generation unit
14: Beam splitter
15: Detection/evaluation unit
16: Evaluation means
$A_0$, i: Signal amplitudes
a, b, c, d, e, f: Coefficients
k: Temperature coefficient
n: Refractive index
r: Electrooptical coefficient
R: Combined electrooptical term ($R=n^3r$)
T: Temperature
$\Delta T$: Temperature discrepancy
V: Voltage
$V_\pi$: Half-cycle voltage
$\lambda_1, \lambda_2$ Wavelengths of the injected beams

What is claimed is:

1. A method for measurement of an electrical voltage V using an electrooptical medium, with the electrooptical medium being subjected to an electric field which is dependent on the voltage V and with at least two polarized light beams of different wavelengths ($\lambda_1, \lambda_2$) being injected into the electrooptical medium, and with output signals $A_1$ and $A_2$ of the light beams being measured, where $A_1$ and $A_2$ are temperature-dependent functions $f_1$ and $f_2$ of the voltage V, and with a search being carried out for those values of the temperature T and of the voltage V which solve the equation system $$A1=f1(T, V) \text{ and } A2=f2(T, V)$$

wherein the at least two polarized light beams are analyzed after passing through the electrooptical medium,
wherein the voltage dependency of the refractive-index change is described by an effective electrooptical coefficient r or by a combined electrooptical term R
where $R=n^3r$, with n being the refractive index of the medium,
wherein a known temperature dependency r=r(T) or R=R(T) is assumed for the effective electrooptical coefficient r or for the combined electrooptical term R,
wherein the known temperature dependency r=r(T) of the effective electrooptical coefficient r or R=R(T) of the combined electrooptical term R is inserted into the equation system, with the temperature T and the voltage V thus being calculated, and
in that the functions $f1$ and $f2$ depend on the voltage V in a non-unique way, and in that that voltage V for which both equations in the equation system are satisfied is determined.

2. The method as claimed in claim 1, wherein a voltage-induced refractive-index change in the medium depends on the electric field via the Pockel effect.

3. The method as claimed in claim 2, wherein a linear temperature dependency $$r(\lambda_i,T)=r(\lambda_i, T_0,)+K_i'\cdot\Delta T \text{ where } \Delta T=T-T_0$$

$$\text{or } r(\lambda_i,T)=R(\lambda_i, T_0,)+K_i\cdot\Delta T \text{ where } \Delta T=T-T_0$$

is assumed for the effective electrooptical coefficient r or for the combined electrooptical term R, with a known magnitude $r(T_0)$ or $R(T_0)$ for a reference temperature $T_0$ and with known proportionality coefficients $K_i'$ or $K_i$, where the index i=1, 2 indicates the different wavelengths ($\lambda_1, \lambda_2$).

4. The method as claimed in claim 1, wherein the electrooptical medium is a crystal, in particular a BGO crystal.

5. An apparatus for measurement of an electrical voltage V, comprising
an electrooptical medium which is subjected to an electric field which is dependent on the voltage V,
a light generation unit for generating at least two light beams of different wavelengths ($\lambda_i, \lambda_2$)
a polarizer (9) and
a detection/evaluation unit for acquiring output signals $A_1$ and $A_2$ of the light beams, where $A_1$ and $A_2$ are temperature-dependent functions $f_1$ and $f_2$ of the voltage V,
with
the light generation unit, the polarizer and the electrooptical medium being optically connected to one another such that at least two polarized light beams of different wavelengths ($\lambda_i, \lambda_2$) can be injected into the electrooptical medium, and
the detection/evaluation unit contains an evaluation means for determination of those values of the temperature T and of the voltage V which are solutions of the equation system $A_1=f_1(T, V)$ and $A_2=f_2(T, V)$,
wherein the apparatus comprises an analyzer,
wherein the electrooptical medium, the analyzer and the detection/evaluation unit are optically connected to one another such that the at least two polarized light beams can be output from the electrooptical medium and can be injected into the detection/evaluation unit such that the at least two polarized light beams can be analyzed in the analyzer,
wherein, in order to determine the solution of the equation system in the evaluation unit, the voltage dependency of the refractive-index change is described by an effective electrooptical coefficient r or by a combined electrooptical term R where $R=n^3r$, where n is the refractive index of the medium, and with a known temperature dependency r=(T) or R=R(T) being assumed for the effective electrooptical coefficient r or for the combined electrooptical term R, and
wherein the functions $f_1$ and $f_2$ are dependent on the voltage V in a non-unique way, and in that the evaluation means can determine that voltage V for which both equations in the equation system are satisfied.

6. The apparatus for measurement of an electrical voltage V as claimed in claim 5, wherein the electrooptical medium has a voltage-induced refractive-index change which is dependent on the electric field via the Pockel effect.

* * * * *